United States Patent
Fober et al.

(10) Patent No.: US 9,312,093 B1
(45) Date of Patent: Apr. 12, 2016

(54) PARTICLE BEAM DEVICE COMPRISING AN ELECTRODE UNIT

(71) Applicant: Carl Zeiss Microscopy GmbH, Jena (DE)

(72) Inventors: Joerg Fober, Heuchlingen (DE); Edgar Fichter, Unterkochen (DE); Kai Schubert, Oberkochen (DE); Dirk Preikszas, Oberkochen (DE); Christian Hendrich, Westhausen (DE); Momme Mommsen, Oberkochen (DE); Michael Schnell, Rechberghausen (DE); Lorenz Lechner, Koenigsbronn (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/321,921

(22) Filed: Jul. 2, 2014

Related U.S. Application Data

(63) Continuation of application No. 14/316,949, filed on Jun. 27, 2014, now abandoned.

(51) Int. Cl.
*H01J 37/26* (2006.01)
*H01J 37/147* (2006.01)

(52) U.S. Cl.
CPC ............. *H01J 37/1471* (2013.01); *H01J 37/26* (2013.01)

(58) Field of Classification Search
USPC ............................................. 250/396 R, 397
See application file for complete search history.

(56) References Cited

U.S. PATENT DOCUMENTS

| | | | |
|---|---|---|---|
| 6,278,124 B1 | 8/2001 | Penberth et al. | |
| 6,855,939 B2 | 2/2005 | Rose et al. | |
| 8,421,028 B2 | 4/2013 | Preikszas | |
| 2012/0025093 A1 | 2/2012 | Biberger et al. | |
| 2012/0025094 A1* | 2/2012 | Benner et al. ............. | 250/396 R |

FOREIGN PATENT DOCUMENTS

| | | |
|---|---|---|
| DE | 10 2010 007 777 A1 | 8/2011 |
| EP | 1 388 882 A2 | 2/2004 |

* cited by examiner

*Primary Examiner* — Nicole Ippolito
*Assistant Examiner* — Hanway Chang
(74) *Attorney, Agent, or Firm* — Muirhead and Saturnelli, LLC

(57) ABSTRACT

A particle beam device comprises a beam generator for generating a particle beam having charged particles and an electrode unit having a first electrode and a second electrode, wherein the first electrode interacts with the second electrode, in particular for guiding, shaping, aligning or correcting the particle beam. Moreover, the particle beam device comprises a low-pass filter being connected with at least one of: the first electrode and the second electrode, using an electrical connection. Additionally, the particle beam device comprises a mounting unit having an opening for the passage of the particle beam, wherein the at least one low-pass filter, the first electrode and the second electrode are arranged at the mounting unit. The electrode unit may comprise more than two electrodes, for example up to 16 electrodes.

21 Claims, 6 Drawing Sheets

PARTICLE BEAM DEVICE COMPRISING AN ELECTRODE UNIT

RELATED APPLICATIONS

This application is a continuation of U.S. application Ser. No. 14/316,949 filed Jun. 27, 2014 (pending), which is incorporated herein by reference.

TECHNICAL FIELD

The application relates to a particle beam device comprising an electrode unit which is used, for example, for deflecting, shaping, correcting and/or aligning a particle beam in the particle beam device. In particular, the particle beam device of this application is an electron beam device or an ion beam device.

BACKGROUND OF THE INVENTION

Electron beam devices, in particular a scanning electron microscope (SEM) or a transmission electron microscope (TEM), are used for examining samples in order to obtain insights with regard to the properties and behaviour of samples under specific conditions.

In the case of an SEM, an electron beam (hereinafter also called primary electron beam) is generated using a beam generator. The electrons of the primary electron beam are accelerated to a predeterminable energy and focused by a beam guiding system, in particular an objective lens, onto a sample to be analyzed (that is to say an object to be analyzed). A high-voltage source having a predeterminable acceleration voltage is used for acceleration purposes. Using a deflection unit, the primary electron beam is guided in a raster-type fashion over a surface of the sample to be analyzed. In this case, the electrons of the primary electron beam interact with the material of the sample to be analyzed. In particular, interaction particles and/or interaction radiation arise(s) as a consequence of the interaction. By way of example, electrons are emitted by the sample to be analyzed (so-called secondary electrons) and electrons of the primary electron beam are backscattered at the sample to be analyzed (so-called backscattered electrons). The secondary electrons and backscattered electrons are detected and used for image generation. An imaging of the sample to be analyzed is thus obtained.

An imaging of a sample to be analyzed is one possible form of analysis of the sample to be analyzed. However, further forms of analysis are known. By way of example, the interaction radiation (for example X-ray radiation or cathodoluminescent light) is detected and evaluated in order to obtain conclusions about the composition of the sample to be analyzed.

Furthermore, it is known from the prior art to use combination devices for processing and/or for analyzing a sample, wherein both electrons and ions can be guided onto a sample to be processed and/or to be analyzed. By way of example, it is known for an SEM to be additionally equipped with an ion beam column. Using an ion beam generator arranged in the ion beam column, ions are generated which are used for processing a sample (for example for removing a layer of the sample or for applying material to the sample) or else for imaging. In this case, the SEM serves, in particular, for observing the processing, but also for further analysis of the processed or non-processed sample. In particular, a particle beam device is known having a first particle beam column having a first beam axis, wherein the first particle beam column is adapted for generating a first particle beam. In addition, the known particle beam device has a second particle beam column, which is provided with a second beam axis and which is adapted for generating a second particle beam. The first particle beam column and the second particle beam column are arranged with respect to one another in such a way that the first beam axis and the second beam axis form a first angle of approximately 50°. Furthermore, the known particle beam device has a sample carrier, which is rotatable about a rotation axis. The rotation axis runs through the center of the sample carrier. Furthermore, the rotation axis forms a second angle with the first beam axis and a third angle with the second beam axis. At the sample carrier, a sample can be arranged on a sample holder, wherein the sample has a sample surface to be processed and/or to be analyzed. The sample holder extends along the rotation axis. The sample surface has a surface normal that forms a fourth angle with the rotation axis.

An imaging system which may be built as mentioned above and comprising an electron beam column may comprise a single correction unit or several correction units. The imaging system may additionally comprise an ion beam column. Thus, this imaging system may comprise the electron beam column, the ion beam column and a single correction unit or several correction units. The correction unit is used or the correction units are used for correcting imaging aberrations, in particular chromatic and spherical aberrations. By correcting these aberrations, the imaging resolution of the imaging system may be improved.

A particle beam device having a mirror corrector is disclosed in U.S. Pat. No. 6,855,939 B2, which is incorporated herein by reference. The particle beam device disclosed in this reference comprises a mirror corrector which is arranged between an electron source and an objective lens. The mirror corrector comprises an electrostatic mirror and a magnetic beam deflector. The magnetic beam deflector is arranged between the electron source and the electrostatic mirror on one hand as well as between the electrostatic mirror and the objective lens on the other hand. Additional electrostatic and/or magnetic lenses, deflecting units for deflecting the particle beam, electrostatic or magnetic beam alignment units and/or multipole units—such as quadrupole units or multipole units of a higher order—are provided in the beam path of the known particle beam device between the electron source and the object to be examined. The aforementioned units may be used for achieving high resolution while imaging the sample.

A deflecting unit is used for guiding a particle beam in a particle beam device, for example a particle beam device as mentioned above. The deflecting unit may be used for deflecting and/or aligning particles of the particle beam—for example electrons or ions—onto the beam path of the particle beam device. An electrostatic deflecting unit may comprise a first deflecting electrode and a second deflecting electrode. A supply unit provides a first potential to the first deflecting electrode and a second potential to the second deflecting electrode. If the first potential and the second potential are identical, the particle beam passes the first deflecting electrode and the second deflecting electrode on a straight line along an optical axis of the particle beam device. If the first potential and the second potential are chosen in such a way that they are different, an electrostatic field is generated between the first deflecting electrode and the second deflecting electrode. The electrostatic field results in a deflection of the particle beam towards a desired direction, in particular towards the optical axis or away from the optical axis.

Correction units in the form of quadrupole units or correction units comprising a higher number of poles—such as octupole units or twelve-pole units (so called dodecapole units) may be used for correction of image aberrations, for example astigmatism of the particle beam. The correction units may be implemented by any kind of multipole system and, therefore, are not restricted to quadrupole units, octupole units or twelve-pole units. All electrodes of the unit may be arranged in a circle.

It is desirable that the potentials applied to the first deflecting electrode and the second deflecting electrode be rather stable. In other words, it is desirable that the signal-to-noise-ratio $V_E/V_N$ with respect to the first and second deflecting electrodes be about $10^5$ to $10^8$, wherein $V_E$ is the potential applied to the electrodes and $V_N$ is the noise potential. $V_N$ is determined using the Root-Mean-Square (RMS) method. To achieve such a desirable signal-to-noise-ratio, it is known from the prior art to apply a potential V in the range of 100 V to 10 kV, for example, and to use first and second deflecting electrodes having rather small dimensions, in particular being smaller than 5 mm in length. However, when using small first and second deflecting electrodes, the structural conditions with respect to adjustment of the first and second deflecting electrodes might lead to misguiding of the particle beam. To overcome this problem, it is known to use first and second deflection electrodes each having a length of more than 5 mm. In this case, however, one has to choose low potentials, for example in the range of 10 V to 50 V. However, disturbances due to existing alternating fields in the range of a few µV to a few hundred µV may lead to misguiding of the particle beam. If the connecting line between the supply unit and the first and second deflecting electrodes is long, for example 1 m to 10 m, high frequency disturbances might affect the signal-to-noise-ratio by deteriorating it. The range of the frequencies of those disturbances depends on the range of the length of the connecting lines. The frequencies of those disturbances may be in the range of 10 to 100 MHz if the connecting lines have a length in the range of 1 m to 10 m.

With regard to the prior art, reference is made, for example, to DE 10 2010 007 777 A1, U.S. Pat. No. 6,278,124 B1 and U.S. Pat. No. 8,421,028 B2, which are incorporated herein by reference.

In view of the aforesaid, it would be desirable to provide a particle beam device with an electrode unit, for example a deflection unit, a quadrupole unit or a correction unit, having low high frequency disturbances and a high signal-to noise-ratio with respect to the electrode unit.

SUMMARY OF THE INVENTION

The particle beam device according to the system described herein comprises at least one beam generator for generating a particle beam having charged particles. Moreover, the particle beam device comprises at least one electrode unit having a first electrode and a second electrode. The first electrode interacts with the second electrode, for example for guiding, shaping, correcting or aligning the particle beam. Moreover, the particle beam device comprises at least one low-pass filter being connected with the first electrode and/or the second electrode using an electrical connection. The cutoff frequency may be chosen, for example in a range of 0.1 Hz to 1 MHz, or in a range of 1 Hz to 400 kHz or in a range of 10 Hz to 100 kHz. The cutoff frequency may be chosen rather low, for example in the range of 0.1 Hz to 10 Hz, for example about 1.5 Hz. The cutoff frequency may be chosen dependent on the function of the electrode unit. If the electrode unit is used for scanning the particle beam over the surface of an object, the cutoff frequency may be about 100 kHz or 1 MHz. If the electrode unit is used for guiding the particle beam along an optical axis of the particle beam device, the cutoff frequency may be about 1.5 Hz, as mentioned above. Disturbance signals with a frequency higher than the cutoff frequency are filtered and attenuated by the low-pass filter.

Additionally, the particle beam device comprises a mounting unit having an opening for the passage of the particle beam. The low-pass filter, the first electrode and the second electrode are arranged at the mounting unit. In particular, the low-pass filter, the first electrode and/or the second electrode are directly attached to or are integrated in the mounting unit. Additionally or alternatively, the low-pass filter, the first electrode and/or the second electrode are indirectly attached to the mounting unit, for example by using connecting lines or connecting elements such as plugs. The connecting lines or connecting elements are arranged between the mounting unit and the low-pass filter, the first electrode and/or the second electrode. According to one embodiment of the system described herein, the first and second electrodes are arranged at a first mounting unit and the low-pass filter is arranged at a second mounting unit. The mounting unit or at least one of the first and second mounting units is arranged in the particle beam device in such a way that the particle beam passes the opening. For example, the particle beam is guided from the beam generator through the opening to an object (that is a sample) to be irradiated. Therefore, the mounting unit is arranged in the vicinity of an optical axis of the particle beam device. The distance between the mounting unit and the optical axis may be in the range of 0.5 mm to 50 mm, wherein the distance is determined as the absolute value of the normal directed from the optical axis to the mounting unit. If the first and second electrodes are arranged at the first mounting unit and if the low-pass filter is arranged at the second mounting unit, the second mounting unit may be arranged in such a way to the optical axis that the distance between the low-pass filter and the first and second electrodes may be up to 500 mm.

The particle beam device according to the system described herein is based on the idea of arranging the mounting unit comprising the low-pass filter and the first and second electrodes in the vicinity of an optical axis of the particle beam device, and therefore, in the vicinity of the particle beam. In particular, the mounting unit comprising the low-pass filter and the first and second electrodes may be arranged in a vacuum chamber of the particle beam device, wherein the vacuum chamber may be the particle beam column, for example. Moreover, the low-pass filter may be arranged in the vicinity of the first and second electrodes such that high frequency disturbances which may occur due to the high frequency disturbances received by the connecting line between a supply unit and the first and second deflecting electrodes are eliminated. For example, the low-pass filter is arranged at a distance in the range of 0.1 cm to 10 cm, in the range of 0.5 cm to 4 cm or in the range of 1 cm to 3 cm from the first and second electrodes. The distance may be shorter than 10 cm. Therefore, the potential or potentials applied to the first and second electrodes is/are rather stable. The potential or the potentials may be variable between ±200 V and/or may be in the range of ±10V to ±1000V. The signal-to-noise-ratio may be in the range of $10^5$ to $10^8$.

The particle beam device may also comprise a supply unit which is connected to the first electrode and the second electrode. The supply unit provides voltages to the first electrode and the second electrode for generating potentials at the first electrode and the second electrode, respectively, for example for guiding, shaping, correcting or aligning the particle beam.

In an exemplary embodiment, it is additionally or alternatively provided that the particle beam device according to the system described herein may further comprise a vacuum chamber, as already mentioned above. The pressure in the vacuum chamber may vary in the range of $10^{-2}$ mbar to $10^{-12}$ mbar. For example, the beam generator and the electrode unit are arranged in the vacuum chamber. In particular, the mounting unit, the first electrode, the second electrode and the at least one low-pass filter are arranged in the vacuum chamber.

In a further exemplary embodiment, it is additionally or alternatively provided that the particle beam device may further comprise at least one of the following features: the first electrode adjoins the opening of the mounting unit and the second electrode adjoins the opening of the mounting unit. For example, the opening comprises an edge, and the first electrode and the second electrode are directly arranged at the edge of the opening.

As mentioned above, the particle beam device according to the system described herein may comprise an optical axis, wherein the optical axis passes the opening of the mounting unit.

In an exemplary embodiment, it is additionally or alternatively provided that the particle beam device may further comprise the feature that the low-pass filter and the first electrode are arranged at a first distance to each other, wherein the first distance is one of: between 0.1 cm and 5 cm, between 0.5 cm and 4 cm and between 1 cm and 3 cm. Additionally or alternatively, another embodiment of the particle beam device according to the system described herein may further comprise the feature that the low-pass filter and the second electrode are arranged at a second distance to each other, wherein the second distance is one of: between 0.1 cm and 5 cm, between 0.5 cm and 4 cm and between 1 cm and 3 cm. The length of the aforementioned distances facilitates elimination of the high frequency disturbances. In one embodiment, the first and second electrodes are arranged at a first mounting unit and the low-pass filter is arranged at a second mounting unit. The second mounting unit may be arranged at a wall of the vacuum chamber or next to a vacuum feedthrough arranged at the wall of the vacuum chamber. This embodiment avoids using long connecting lines between the vacuum feedthrough and the low-pass filter which may lead to frequency disturbances for other units of the particle beam device. In a further embodiment, two low-pass filters may be used. One of those low-pass filters is arranged in the vicinity of the first and second electrodes, whereas the other of those low-pass filters is arranged at the vacuum feedthrough.

As mentioned above, the first electrode and the second electrode are connected to the low-pass filter using an electrical connection such as a connecting line. In particular, the first electrode is connected to the low-pass filter using a first electrical connection and the second electrode is connected to the low-pass filter using a second electrical connection. Additionally or alternatively, an embodiment of the particle beam device according to the system described herein may comprise the feature that the electrical connection, for example the first electrical connection and/or the second electrical connection, has a length being one of: between 0 cm and 5 cm, between 0.5 cm and 4 cm and between 1 cm and 3 cm. Therefore, the low-pass filter, on one hand, and the first electrode and/or the second electrode, on the other hand, are arranged adjacent to each other.

In a further exemplary embodiment, it is additionally or alternatively provided that the particle beam device may further comprise several low-pass filters. For example, the particle beam device may comprise the above mentioned low-pass filter as a first low-pass filter. Furthermore, the particle beam device may comprise a second low-pass filter being arranged at the mounting unit, wherein the first low-pass filter is connected with the first electrode and wherein the second low-pass filter is connected with the second electrode. This embodiment is based on the idea that each electrode is associated with a separate low-pass filter.

Additionally or alternatively, an embodiment of the particle beam device according to the system described herein may comprise more than two electrodes. For example, the electrode unit may comprise the first electrode, the second electrode, a third electrode and a fourth electrode. As mentioned above, the first electrode interacts with the second electrode, for example for guiding, shaping, correcting or aligning the particle beam. Moreover, the third electrode interacts with the fourth electrode for guiding, shaping, correcting or aligning the particle beam. Thus, this embodiment of the particle beam device comprises two pairs of electrodes. The first pair comprises the first and second electrodes, and the second pair comprises the third and fourth electrodes. The particle beam device may further comprise a further low-pass filter being connected with at least one of: the third electrode and the fourth electrode, using a further electrical connection. The further low-pass filter, the third electrode and the fourth electrode are arranged at the mounting unit. Additionally or alternatively, each of the third electrode and the fourth electrode may be associated with an individual low-pass filter. For example, the third electrode is associated with a third low-pass filter and the fourth electrode is associated with a fourth low-pass filter. The particle beam device according to the system described herein is not restricted to an electrode unit which comprises four electrodes. Instead, any multipole unit comprising a specific number of electrodes depending on the multipole unit may be used. For example, a multipole unit with 8 electrodes, 12 electrodes or 16 electrodes may be used.

In a further exemplary embodiment, it is additionally or alternatively provided that the particle beam device may comprise a circuit board as the mounting unit. The circuit board may comprise the low-pass filter or the low-pass filters. The low-pass filter may be integrated in the circuit board. Additionally or alternatively, the circuit board may comprise mounting devices for the electrodes, such as slots.

Additionally or alternatively, a further embodiment of the particle beam device according to the system described herein may comprise an encapsulated housing. The mounting unit may be arranged in the encapsulated housing. The encapsulated housing may be made of a conductive material, for example titanium, aluminium or stainless steel, and protects the low-pass filter and the electrodes with respect to charge effects and stray electrons. Moreover, the particle beam is shielded from stray fields generated at the connecting lines used for electrically connecting the first and second electrodes and/or the low-pass filter(s).

In an exemplary embodiment, it is additionally or alternatively provided that the mounting unit itself is an encapsulated housing.

In a further exemplary embodiment, it is additionally or alternatively provided that the particle beam device according to the system described herein may comprise an objective lens for focusing the particle beam on an object and a detector for detecting at least one of: interaction particles and interaction radiation generated by interaction of the particle beam with the object. For example, the detector detects secondary particles—for example secondary electrons—, backscattered particles (for example backscattered electrons) and/or electromagnetic radiation—for example X-rays.

Additionally or alternatively, an embodiment of the particle beam device according to the system described herein may be an electron beam device, for example an SEM or a TEM. Additionally or alternatively, a further embodiment of the particle beam device according to the system described herein may be an ion beam device. Additionally or alternatively, the particle beam device may be an electron beam device comprising at least one correction unit for correcting aberrations during imaging, in particular chromatic aberrations and/or spherical aberrations. This way, the imaging performance is improved. Such an electron beam device may be an SEM comprising a mirror corrector.

In a further exemplary embodiment, it is additionally or alternatively provided that the electrode unit may be a deflection unit. The first electrode may be a first deflecting electrode, and the second electrode may be a second deflecting electrode. In another exemplary embodiment, it is additionally or alternatively provided that the third electrode may be a third deflecting electrode and the fourth electrode may be a fourth deflecting electrode.

In an exemplary embodiment, it is additionally or alternatively provided that the electrode unit may comprise at least one correction unit, at least one deflection unit and/or at least one multipole unit. Therefore, the particle beam device according to the system described herein may comprise any combination and number of correction units, deflection units and multipole units.

A further particle beam device according to the system described herein may comprise one of the above or below mentioned features or a combination of at least two of the above or below mentioned features. In particular, this particle beam device may comprise at least one beam generator for generating a particle beam having charged particles and at least one electrode unit comprising a first electrode and a second electrode, wherein the first electrode interacts with the second electrode, for example for guiding, shaping, correcting or aligning the particle beam. The particle beam device also comprises at least one low-pass filter being connected with at least one of: the first electrode and the second electrode, using an electrical connection. Moreover, the particle beam device comprises a vacuum chamber, wherein the at least one low-pass filter, the first electrode and the second electrode are arranged in the vacuum chamber. The electrode unit may be a deflection unit, wherein the first electrode may be a first deflecting electrode and the second electrode may be a second deflecting electrode. Additionally or alternatively it is provided that the electrode unit may comprise at least one correction unit, at least one deflection unit and/or at least one multipole unit. Therefore, the particle beam device according to the system described herein may comprise any combination and number of correction units, deflection units and multipole units.

All embodiments of the particle beam device mentioned in this application may comprise an aberration corrector unit to correct for at least one of: chromatic aberration and spherical aberration of the particle beam.

BRIEF DESCRIPTION OF THE DRAWINGS

Embodiments of the particle beam device are explained in greater detail below on the basis of the figures, which are briefly described as follows.

DETAILED DESCRIPTION OF VARIOUS EMBODIMENTS

Figure 1A:
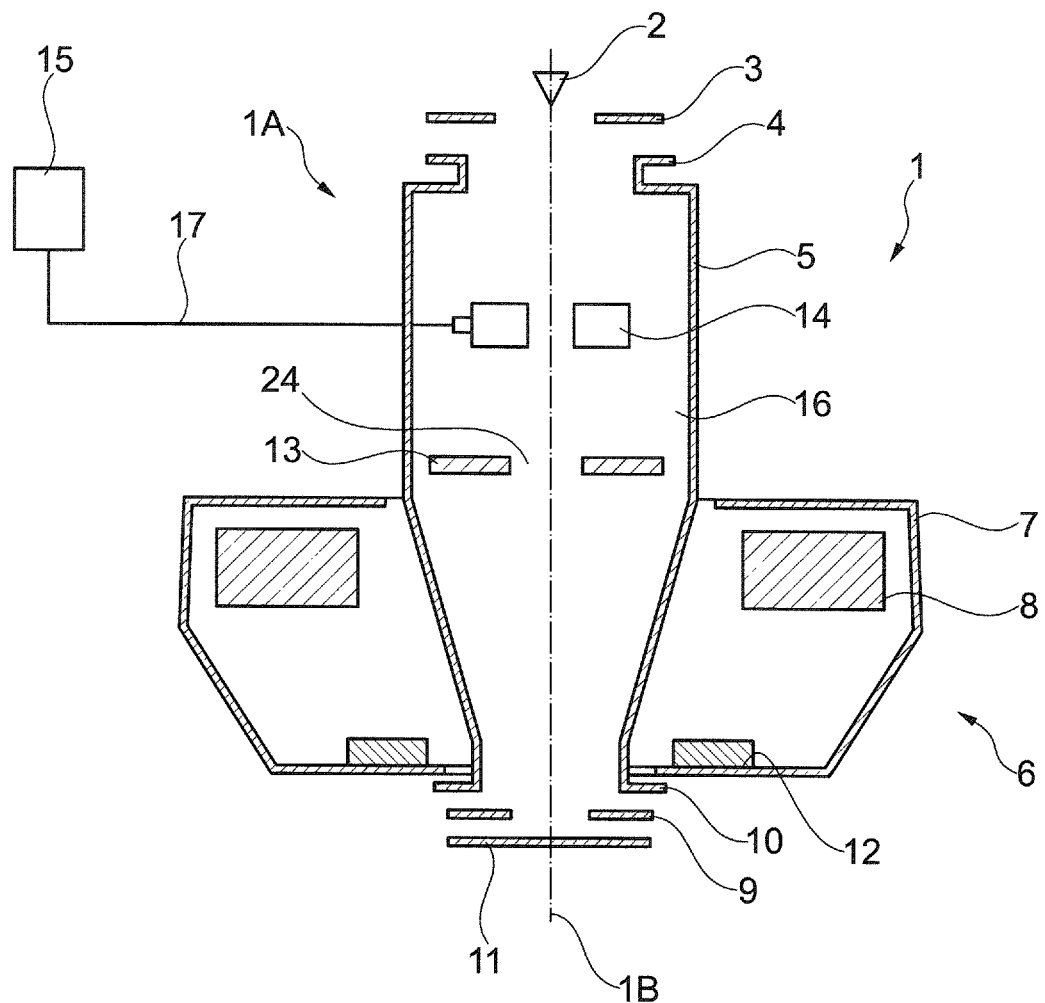
FIG. 1A shows a schematic illustration of a first embodiment of a particle beam device.

FIG. 1A shows a schematic illustration of a particle beam column 1A of a particle beam device 1, which column is embodied as an electron beam column and, in principle, corresponds to an electron beam column of a scanning electron microscope. However, reference is explicitly made here to the fact that the system described herein is not restricted to a scanning electron microscope. Rather, the system described herein can be used in any particle beam device, in particular in an ion beam device.

The particle beam column 1A has an optical axis 1B, a beam generator in the form of an electron source 2 (cathode), an extraction electrode 3 and an anode 4, which at the same time forms one end of a beam guiding tube 5. By way of example, the electron source 2 may be a thermal field emitter. Electrons which emerge from the electron source 2 are accelerated by the anode 4 as a result of a potential difference between the electron source 2 and the anode 4. Accordingly, a particle beam in the form of an electron beam is provided.

Furthermore, the particle beam column 1A has an objective lens 6. The objective lens 6 is provided with a bore, through which the beam guiding tube 5 is guided. Furthermore, the objective lens 6 has a pole piece 7, in which coils 8 are arranged.

Connected downstream of the beam guiding tube 5 is an electrostatic retardation apparatus. The latter comprises an individual electrode 9 and a tube electrode 10. The tube electrode 10 is applied to the end of the beam guiding tube 5 adjacent to a carrier element 11. The carrier element 11 is a movable sample stage having a sample receptacle (not shown), on which a sample can be arranged (not shown). The carrier element 11 has movement elements which ensure movement of the carrier element 11 in such a way that a region of interest on the sample can be examined using the particle beam.

Together with the beam guiding tube 5, the tube electrode 10 lies at the anode potential. By contrast, the individual electrode 9 and a sample arranged on the carrier element 11 lie at a lower potential as compared to the anode potential. This is how the electrons of the particle beam can be decelerated to a desired energy required for examining a sample arranged on the carrier element 11. The particle beam column 1A moreover has a scanning device 12, by which the particle beam can be deflected and scanned over the sample arranged on the carrier element 11.

The beam guiding tube 5 comprises a chamber 16 which is a vacuum chamber. The pressure in the chamber 16 is in the range of $10^{-2}$ mbar to $10^{-12}$ mbar. However, the pressure may also be in the range of $10^{-6}$ mbar to $10^{-9}$ mbar or any other suitable pressure.

The particle beam column 1A may comprise differentially pumped areas which may have different pressures. Thus, the particle beam device 1 may comprise several vacuum chambers which may be connected to each other. The carrier element 11, a lower part of the objective lens 6 and the individual electrode 9 may extend in or into a further vacuum chamber (not shown in FIG. 1A).

For imaging purposes, secondary electrons and/or backscattered electrons are detected using a detector 13 arranged in the chamber 16 of the beam guiding tube 5, which secondary electrons and/or backscattered electrons are generated as a result of the interaction of the particle beam with the sample arranged on the carrier element 11. The signals generated by the detector 13 are transmitted to an electronic unit (not shown) for imaging purposes.

An electrode unit in the form of a deflection unit 14 is also arranged in the chamber 16 of the beam guiding tube 5. The deflection unit 14 is schematically illustrated in FIG. 1A and will be described in detail further below. The deflection unit 14 is connected with a supply unit 15 via a supply line 17. The supply unit 15 provides voltages for generating potentials at deflecting electrodes which are explained further below.

Figure 1B:
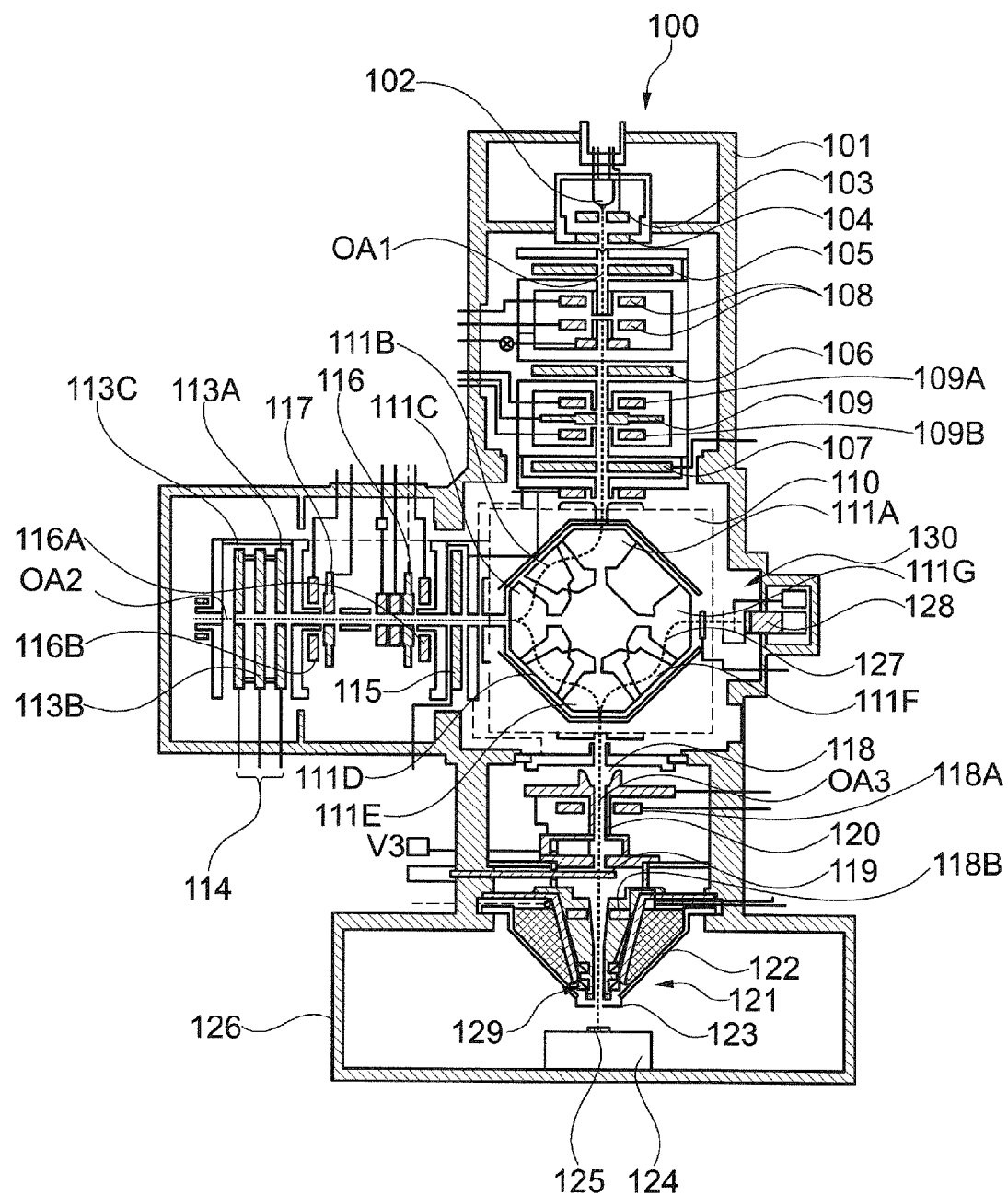
FIG. 1B shows a schematic illustration of a second embodiment of a particle beam device comprising a correction unit.

FIG. 1B is a schematic illustration of a further embodiment of the particle beam device according to the system described herein. This embodiment of the particle beam device is denoted with reference sign 100 and comprises a mirror corrector for correcting, for example, chromatic and spherical aberrations. This will be explained in detail further below. The particle beam device 100 comprises a particle beam column 101 being embodied as an electron beam column and, in principle, corresponds to an electron beam column of a corrected SEM. However, the particle beam device 100 according to the system described herein is not restricted to an SEM with a mirror corrector. Rather, any particle beam device comprising correction units may be used.

The particle beam column 101 comprises a beam generator in the form of an electron source 102 (cathode), an extraction electrode 103 and an anode 104. By way of example, the electron source 102 may be a thermal field emitter. Electrons which emerge from the electron source 102 are accelerated by the anode 104 as a result of a potential difference between the electron source 102 and the anode 104. Accordingly, a particle beam in the form of an electron beam is provided along a first optical axis OA1.

The particle beam is guided along a beam path which—after the particle beam has emerged from the electron source 102—is the first optical axis OA1, using a first electrostatic lens 105, a second electrostatic lens 106 and a third electrostatic lens 107. The particle beam is adjusted along the beam path using at least one beam alignment device. The beam alignment device of this embodiment comprises a gun alignment unit comprising two magnetic deflection units 108 arranged along the first optical axis OA1. Furthermore, the particle beam device 100 comprises electrostatic beam deflection units. A first electrostatic beam deflection unit 109 is arranged between the second electrostatic lens 106 and the third electrostatic lens 107. The first electrostatic beam deflection unit 109 is also arranged downstream of the magnetic deflection units 108. A first multipole unit 109A in the form of a first magnetic deflection unit is arranged at one side of the first electrostatic beam deflection unit 109. Furthermore, a second multipole unit 109B in the form of a second magnetic deflection unit is arranged at the other side of the first electrostatic beam deflection unit 109. The first electrostatic beam deflection unit 109, the first multipole unit 109A and the second multipole unit 109B are used for adjusting the particle beam with respect to an entrance window of a beam deflection device 110. The first electrostatic beam deflection unit 109, the first multipole unit 109A and the second multipole unit 109B compose a unit which works similar to a Wien filter. The first electrostatic beam deflection unit 109 will be described in detail further below.

The beam deflection device 110 is used as a particle-optical beam splitter which deflects the particle beam in a specific way. The beam deflection device 110 comprises several magnetic sectors, namely a first magnetic sector 111A, a second magnetic sector 111B, a third magnetic sector 111C, a fourth magnetic sector 111D, a fifth magnetic sector 111E, a sixth magnetic sector 111F and a seventh magnetic sector 111G. The particle beam enters the beam deflection device 110 along the first optical axis OA1 and is deflected by the beam deflection device 110 in the direction of a second optical axis OA2. The beam deflection is provided by the first magnetic sector 111A, the second magnetic sector 111B and the third magnetic sector 111C. The second optical axis OA2 is arranged at an angle of 30° to 120° to the first optical axis OA1. The beam deflection device 110 also deflects the particle beam which is guided along the second optical axis OA2 in the direction of a third optical axis OA3. The beam deflection is provided by the third magnetic sector 111C, the fourth magnetic sector 111D and the fifth magnetic sector 111E. In the embodiment shown in FIG. 1B, deflecting to the second optical axis OA2 and to the third optical axis OA3 will be done by deflecting the particle beam at an angle of 90°. Thus, the third optical axis OA3 runs coaxially to the first optical axis OA1. However, the particle beam device 100 according to the system described herein is not restricted to deflection angles of 90°. Instead, any suitable deflection angle may be used with the beam deflection device 110, for example 70° or 110° such that the first optical axis OA1 does not run coaxially to the third optical axis OA3. For further details of the beam deflection device 110 reference is made to EP 1 388 882 A2 which is incorporated herein by reference.

After being deflected by the first magnetic sector 111A, the second magnetic sector 111B and the third magnetic sector 111C, the particle beam is guided along the second optical axis OA2. The particle beam is guided to an electrostatic mirror 114 and passes—on its way to the electrostatic mirror 114—a fourth electrostatic lens 115, a third multipole unit 116A in the form of a magnetic deflection unit, a second electrostatic beam deflection unit 116, a third electrostatic beam deflection unit 117 and a fourth multipole unit 116B in the form of a magnetic deflection unit. The electrostatic mirror 114 comprises a first mirror electrode 113A, a second mirror electrode 113B and a third mirror electrode 113C. The second electrostatic beam deflection unit 116 and the third electrostatic beam deflection unit 117 will be described in detail further below. Electrons of the particle beam which are reflected back by the electrostatic mirror 114 onto the second optical axis OA2 enter again the beam deflection device 110 and are deflected by the third magnetic sector 111C, the fourth magnetic sector 111D and the fifth magnetic sector 111E towards the third optical axis OA3. The electrons of the particle beam exit the beam deflection device 110, being guided along the third optical axis OA3.

When being guided along the third optical axis OA3, the particle beam is directed to a sample 125 to be examined. On its way to the sample 125, the particle beam passes a fifth electrostatic lens 118, a beam guiding tube 120, a fifth multipole unit 118A, a sixth multipole unit 118B and an objective lens 121. The fifth electrostatic lens 118 is an electrostatic immersion lens. The particle beam is decelerated or accelerated by the fifth electrostatic lens 118 to the electrical potential of the beam guiding tube 120. The particle beam is focused by the objective lens 121 in a focal plane in which the sample 125 is positioned. The sample 125 is arranged on a movable sample stage 124. The movable sample stage 124 is arranged in a vacuum chamber 126 of the particle beam device 100.

The objective lens 121 may be implemented as a combination of a magnetic lens 122 and a sixth electrostatic lens 123. The end of the beam guiding tube 120 may be one electrode of an electrostatic lens and particles of the particle beam, after exiting from the beam guiding tube 120, are decelerated to the potential of the sample 125 arranged on the sample stage 124 in the proximity of the focal plane of the objective lens 121. The objective lens 121 is not restricted to a combination of the magnetic lens 122 and the sixth electrostatic lens 123. Instead, the objective lens 121 may be implemented in any suitable form. In particular, the objective lens 121 may also be just a magnetic lens or just an electrostatic lens.

The particle beam focused on the sample 125 interacts with the sample 125. Interaction particles are generated. In particular, secondary electrons are emitted by the sample 125 and backscattered electrons are returned with or without a loss of kinetic energy from the sample 125. The secondary electrons and the backscattered electrons are again accelerated and are guided into the beam guiding tube 120 along the third optical axis OA3. In particular, the secondary electrons and backscattered electrons travel on the beam path of the particle beam in the opposite direction.

The particle beam device 100 comprises a first detector 119 which is arranged along the beam path between the beam deflection device 110 and the objective lens 121. The first detector 119 may comprise an opening through which the primary particles of the particle beam are guided to the sample 125. Secondary electrons which are guided in directions oriented at large angles with respect to the third optical axis OA3 are detected by the first detector 119. However, backscattered electrons and secondary electrons which are guided in directions oriented at small angles with respect to the third optical axis OA3—that means backscattered electrons and secondary electrons which travel in a narrow angle range around the third optical axis OA3—enter the beam deflection device 110 and are deflected by the fifth magnetic sector 111E, the sixth magnetic sector 111F and the seventh magnetic sector 111G along a detection beam path 127 to a second detector 128. The total deflection angle may be, for example, 90° or 110°. The second detector 128 generates detection signals based on the detected backscattered electrons and secondary electrons.

The first detector 119 also generates detection signals based on the emitted secondary electrons. The detection signals generated by the first detector 119 and the second detector 128 are transmitted to an electronic unit (not shown) and are used to obtain information about the properties of the interaction area of the focused particle beam with the sample 125. If the focused particle beam is scanned over the sample 125 using a scanning device 129, and if the electronic unit acquires and stores the detection signals generated by the first detector 119 and the second detector 128, an image of the scanned area of the sample 125 can be acquired and displayed by the electronic unit.

A filter electrode 130 may be arranged in front of the second detector 128. The filter electrode may be used to separate the secondary electrons from the backscattered electrons due to the kinetic energy difference of the secondary electrons and of the backscattered electrons.

Moreover, a potential different from 0 V may be applied to the sample 125.

Figure 2:
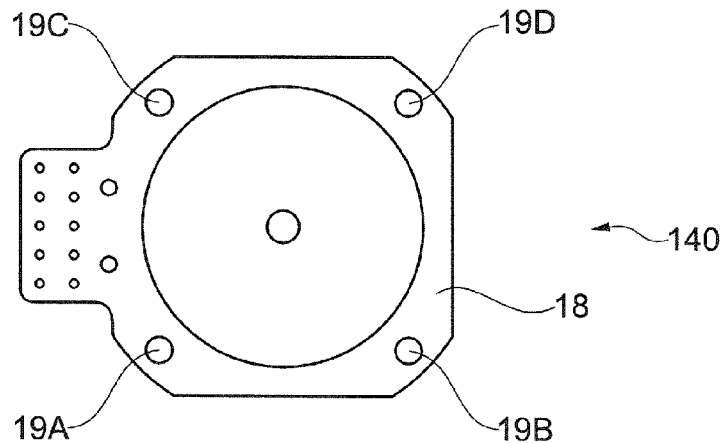
FIG. 2 schematically shows an outside view of an encapsulated housing.
Figure 3A:
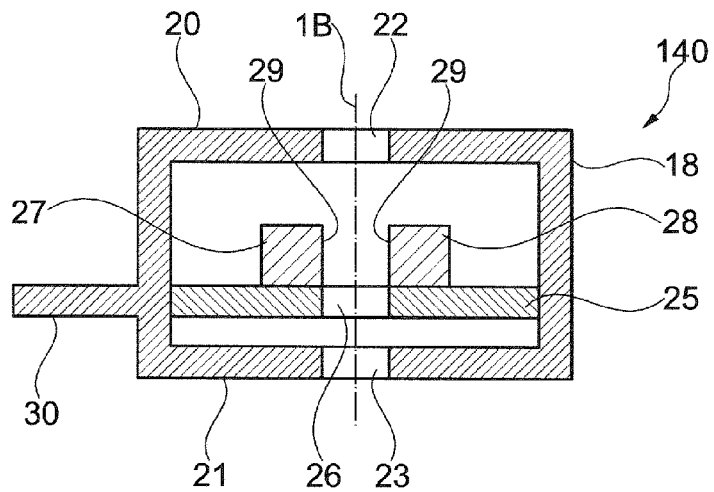
FIG. 3A shows a sectional view of a first embodiment of the encapsulated housing according to FIG. 2.
Figure 3B:
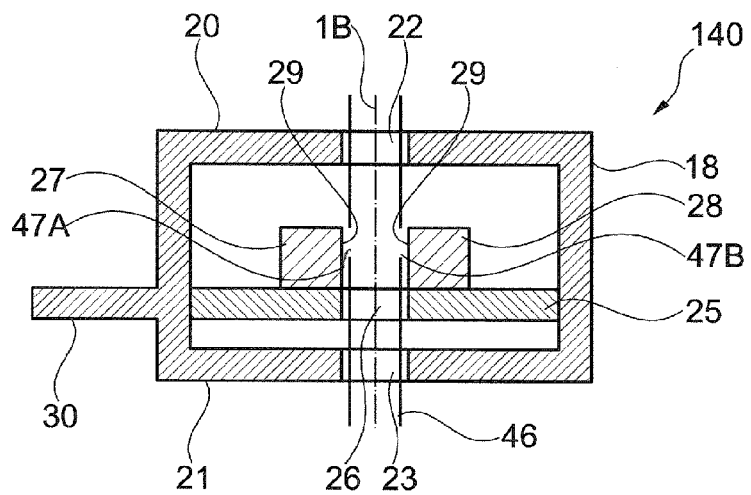
FIG. 3B shows a sectional view of a second embodiment of the encapsulated housing according to FIG. 2.

The structure of an electrode unit 140 as shown in FIG. 2, FIG. 3A and FIG. 3B—which may be implemented as the deflection unit 14, the first electrostatic beam deflection unit 109, the second electrostatic beam deflection unit 116 or the third electrostatic beam deflection unit 117—will now be explained in detail with respect to the deflection unit 14. It should be noted that the further deflection units have a similar or identical structure. The electrode unit 140 may also be any multipole unit in the form of a quadrupole unit used in the particle beam device 1 according to FIG. 1A or the particle beam device 100 according to FIG. 1B. Moreover, the electrode unit 140 may be a correction unit used in the particle beam device 100 shown in FIG. 1B.

The electrode unit 140 comprises an encapsulated housing 18 which may be formed using a suitable material, for example a conductive material such as titanium or stainless steel. However, the encapsulated housing 18 may also be formed using a plastic material, such as a fiber reinforced material, comprising a conductive layer. FIG. 2 schematically shows an outside view of the encapsulated housing 18. FIG. 3A shows a sectional view of the encapsulated housing 18. The encapsulated housing 18 comprises mounting holes, namely a first mounting hole 19A, a second mounting hole 19B, a third mounting hole 19C and a fourth mounting hole 19D. The mounting holes 19A to 19D are arranged at the edge of encapsulated housing 18 in such a way that connecting elements, for example screws and bolts, may be arranged in the mounting holes 19A to 19D to fix the encapsulated housing 18 to a holding device (not shown) within the chamber 16 of the beam guiding tube 5.

The encapsulated housing 18 of the electrode unit 140 comprises a first side 20 oriented towards the electron source 2 and a second side 21 oriented towards the objective lens 6. The first side 20 and the second side 21 are arranged substantially parallel to each other. Each side 20 and 21 comprises an opening. The first side 20 comprises a first opening 22, while the second side 21 comprises a second opening 23. The first opening 22 and the second opening 23 are shaped substantially circular. The optical axis 1B passes through the first opening 22 and the second opening 23 in such a way that the particle beam may pass the first opening 22 and the second opening 23 and is guided in the direction of the carrier element 11.

As shown in FIG. 1A, the detector 13 of the embodiment of the particle beam device 1 also comprises an opening, namely a third opening 24. The optical axis 1B also passes through the third opening 24 in such a way that the particle beam may pass the third opening 24 and is guided in the direction of the carrier element 11.

The electrode unit 140 also comprises a mounting unit 25 in the form of a circuit board as shown in FIG. 3A. The mounting unit 25 may be arranged in the encapsulated housing 18 or may be integrated in the encapsulated housing 18 in such a way that the encapsulated housing 18 and the mounting unit 25 are made as one piece. The mounting unit 25 also has an opening, namely a fourth opening 26. The fourth opening 26 is shaped substantially circular. The optical axis 1B passes through the fourth opening 26 in such a way that the particle beam may pass the fourth opening 26 and is guided in the direction of the carrier element 11 after having passed the second opening 23 arranged at the second side 21. The first opening 22, the second opening 23 and the fourth opening 26 can be positioned in a centric manner to each other, i.e. the centers of all three openings 22, 23 and 26 can be positioned on a common straight axis.

The mounting unit 25 comprises four electrodes which are arranged at an angle of 90°. The electrodes may be deflecting electrodes if the electrode unit is a deflecting unit. Two of the electrodes are shown in FIG. 3A, namely a first electrode 27 and a second electrode 28. The electrodes, in particular the first electrode 27 and the second electrode 28, are cubical, their dimensions being 5 mm×5 mm×5 mm. It is explicitly mentioned that the system described herein is not restricted to the aforementioned shape and dimensions. Instead, any suitable shape and dimensions may be used.

Each electrode, in particular the first electrode 27 and the second electrode 28, has a side wall 29 which is oriented towards the optical axis 1B and which adjoins the fourth opening 26 of the mounting unit 25. Therefore, each electrode is directly arranged at the edge of the fourth opening 26.

The mounting unit 25 comprises slots in which the electrodes, in particular the first electrode 27 and the second electrode 28, are arranged. Thus, the electrodes are directly attached to the mounting unit 25.

FIG. 3B shows a further embodiment of the electrode unit 140. The embodiment of FIG. 3B is based on the embodiment shown in FIG. 3A. Identical reference signs denote identical elements. The embodiment of FIG. 3B comprises a tube 46 which is guided through the first opening 22, the second opening 23 and the fourth opening 26. The tube 46 comprises recesses, openings and/or windows which are arranged next to the electrodes of the electrode unit 140, wherein each electrode has an associated recess. FIG. 3B shows two of those recesses, namely a first recess 47A and a second recess 47B. The first recess 47A is arranged next to the first electrode 27 and the second recess 47B is arranged next to the second electrode 28. The recesses are used for the reach-through of a generated field, for example an electrostatic field. This embodiment allows for use of high voltages, and the effective surface of the electrodes may be chosen small. Moreover, components related to the first electrode 27 and/or the second electrode 28—such as, for example, insulating components, ceramic holdings and/or circuit board surfaces—are protected by using the tube 46 from getting charged. The effective surface is given by the dimension of the recesses which are arranged next to the electrodes. The shape of the recesses may be, for example, round, elliptical, rectangular or hexagonal. However, the shape of the recesses is not restricted to the afore-mentioned shapes. In fact, any suitable geometrical shape may be chosen.

Figure 4:
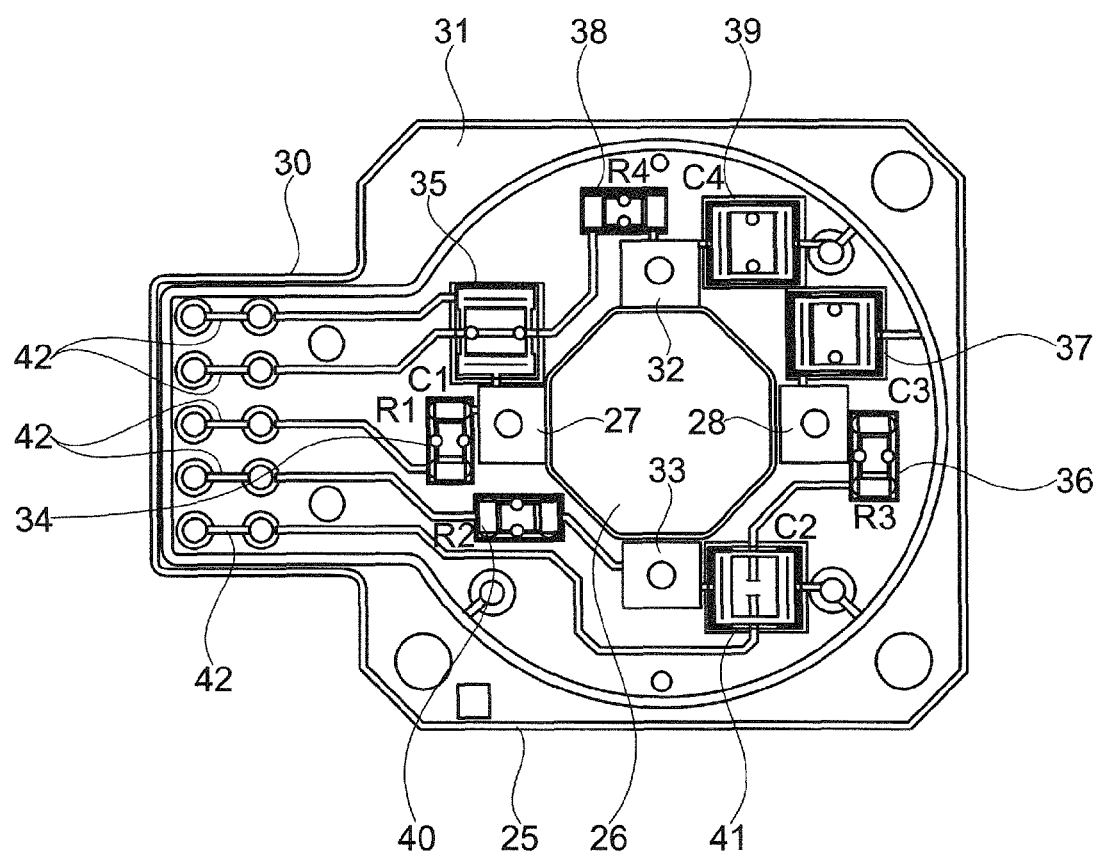
FIG. 4 shows a top view of a mounting unit.

FIG. 4 shows a top view of the mounting unit 25 in the form of a circuit board.

The mounting unit 25 comprises two parts, namely a connecting part 30 and a main board 31. The main board 31 comprises the electrodes, namely the first electrode 27, the second electrode 28, a third electrode 32 and a fourth electrode 33. As mentioned above, the four electrodes 27, 28, 32 and 33 are arranged at an angle of 90° and are arranged directly at the fourth opening 26 as explained above.

As shown in FIG. 4, each electrode 27, 28, 32 and 33 is associated with an individual low-pass filter comprising a resistor and capacitor. In particular, the first electrode 27 is associated with a first low-pass filter comprising a first resistor 34 and a first capacitor 35. Likewise, the second electrode 28 is associated with a second low-pass filter comprising a second resistor 36 and a second capacitor 37. The third electrode 32 is associated with a third low-pass filter comprising a third resistor 38 and a third capacitor 39. Finally, the fourth electrode 33 is associated with a fourth low-pass filter comprising a fourth resistor 40 and a fourth capacitor 41.

The mounting unit 25 in the form of the circuit board comprises conductive tracks 42. Some of the conductive tracks 42 are shown in FIG. 4. Others are arranged on the backside of the mounting unit 25 and, therefore, are not shown in FIG. 4.

Figure 5:
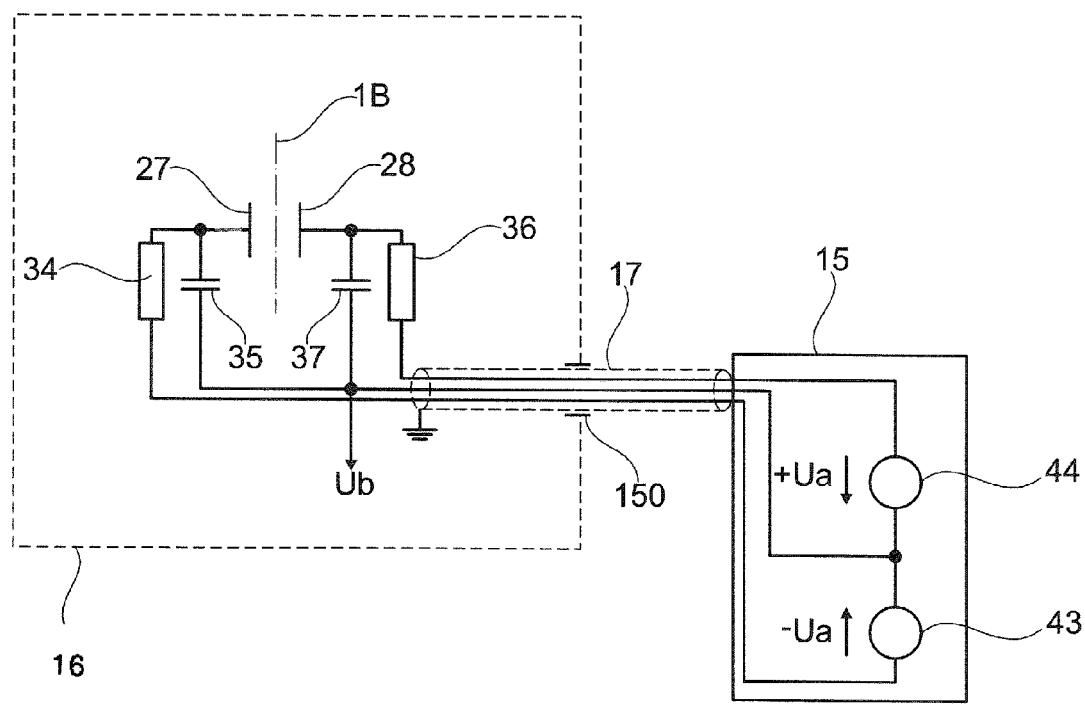
FIG. 5 is a schematic view of a circuit diagram showing a first electrode and a second electrode.

Each low-pass filter is connected to the associated electrode and the supply unit 15. This is explained in more detail with respect to FIG. 5, which shows the first pair of electrodes, namely the first electrode 27 and the second electrode 28. In particular, FIG. 5 is a schematic view of a circuit diagram showing the first electrode 27 and the second electrode 28 as well as their associated low pass-filters. The circuit diagram shown in FIG. 5 also applies to the third electrode 32, the fourth electrode 33 and their associated low-pass filters.

The first electrode 27 is connected to the first resistor 34 and the first capacitor 35 via connecting lines. The first resistor 34 and the first capacitor 35 are also connected to a first voltage source 43 of the supply unit 15 via connecting lines. More precisely, the first resistor 34 is connected to one pole of the first voltage source 43 and the first capacitor 35 is connected to another pole of the first voltage source 43. The second electrode 28 is connected to the second resistor 36 and the second capacitor 37 via connecting lines. Moreover, the second resistor 36 and the second capacitor 37 are also connected to a second voltage source 44 of the supply unit 15 via connecting lines. More precisely, the second resistor 36 is connected to one pole of the second voltage source 44 and the second capacitor 36 is connected to another pole of the second voltage source 44.

The first capacitor 35 and the second capacitor 37 are connected to a reference potential Ub of the first electrode 27 and the second electrode 28. In other words, the bases of the first low-pass filter and the second low-pass filter are connected to the reference potential Ub. The reference potential Ub may be any suitable potential. In a preferred embodiment, the reference potential Ub may be the potential of the anode 4 of the particle beam device 1, the anode 104 of the particle beam device 100 or the ground potential.

All connecting lines to the supply unit 15 are arranged in the supply line 17. The supply unit 15 may be arranged at a considerable distance from the particle beam column 1A. This distance may be in the range of 1 m to 15 m or 0.5 m to 10 m, for example.

As shown in FIG. 5, the first electrode 27, the second electrode 28 and their associated low-pass filters are arranged in the chamber 16. The supply line 17 is guided into the chamber 16 by using a vacuum feedthrough 150 being arranged at a wall of the chamber 16.

The first electrode 27 interacts with the second electrode 28 for guiding, shaping, correcting or aligning the particle beam. Moreover, the third electrode 32 interacts with the fourth electrode 33 for guiding, shaping, correcting or aligning the particle beam. Potentials are provided at the first electrode 27, the second electrode 28, the third electrode 33 and the fourth electrode 33 using the supply unit 15. If an identical potential is applied to the electrodes 27, 28, 32 and 33 and if the identical potential is the same as the potential of the surrounding—for example the anode potential—the particle beam passes the electrodes 27, 28, 32 and 33 on a straight line along the optical axis 1B. If an identical potential is applied to the electrodes 27, 28, 32 and 33 and if the identical potential is not the same as the potential of the surrounding—for example the anode potential—the particle beam may be deflected slightly by the electrodes 27, 28, 32 and 33. If different potentials are applied to the first electrode 27 and the second electrode 28, an electrostatic field is generated between the first electrode 27 and the second electrode 28. The path of the particle beam is, for example, deflected in a first direction, and the particle beam is guided away from or towards the optical axis 1B. Moreover, if different potentials are applied to the third electrode 32 and the fourth electrode 33, an electrostatic field is generated between the third electrode 32 and the fourth electrode 33. The path of the particle beam is, for example, deflected in a second direction which may be approximately perpendicular to the first direction, and the particle beam is guided away from or towards the optical axis 1B.

As shown in FIG. 1A, the electrodes 27, 28, 32 and 33 and their associated low-pass filters are arranged in the chamber 16 of the particle beam device 1 in the vicinity of the optical axis 1B. For example, the first resistor 34, the first capacitor 35, the second resistor 36, the second capacitor 37, the third resistor 38, the third capacitor 39, the fourth resistor 40 and the fourth capacitor 41 are arranged at a distance in the range of 0.5 cm to 20 cm or in the range of 1 cm to 15 cm from the optical axis 1B, wherein the distance is given by the normal of the optical axis 1B to a center of the respective resistors 34, 36, 38 and 40 as well as to a center of the respective capacitors 35, 37, 39 and 41.

Moreover, the electrodes 27, 28, 32 and 33 are arranged in the vicinity of their associated low-pass filters. In particular, the first electrode 27 is arranged in the vicinity of the first resistor 34 and the first capacitor 35. Moreover, the second electrode 28 is arranged in the vicinity of the second resistor 36 and the second capacitor 37. The third electrode 32 is arranged in the vicinity of the third resistor 38 and the third capacitor 39. Furthermore, the fourth electrode 33 is arranged in the vicinity of the fourth resistor 40 and the fourth capacitor 41.

For example, the electrodes 27, 28, 32 and 33, their associated resistors 34, 36, 38 and 40 and their associated capacitors 35, 37, 39 and 41 are arranged at a distance in the range of 0.1 cm to 5 cm, in the range of 0.5 cm to 4 cm or in the range of 1 cm to 3 cm to each other. The distance is, for example, given by the distance of the edges of the electrodes, the resistors and capacitors nearest to each other. High frequency disturbances received via the supply line 17 are eliminated. Therefore, the potential or potentials applied to the deflecting electrodes 27, 28, 32 and 33 is/are rather stable. The potential or the potentials may be variable between by ±200 V and/or may be in the range of ±10 V to ±1000 V. The signal-to-noise-ratio may be in the range of $10^5$ to $10^8$.

The capacities of the capacitors and the resistance of the resistors are selected in a manner that the cutoff frequency of the resulting low-pass filter has a desired value, for example, in a range of 1 Hz to 10 Hz in the case that the electrode unit is used for beam adjustment purposes or, for example, in a range of 1 to 1 MHz in the case that the electrode unit is used as a scanning unit for scanning the particle beam over the surface of an object.

Figure 6:
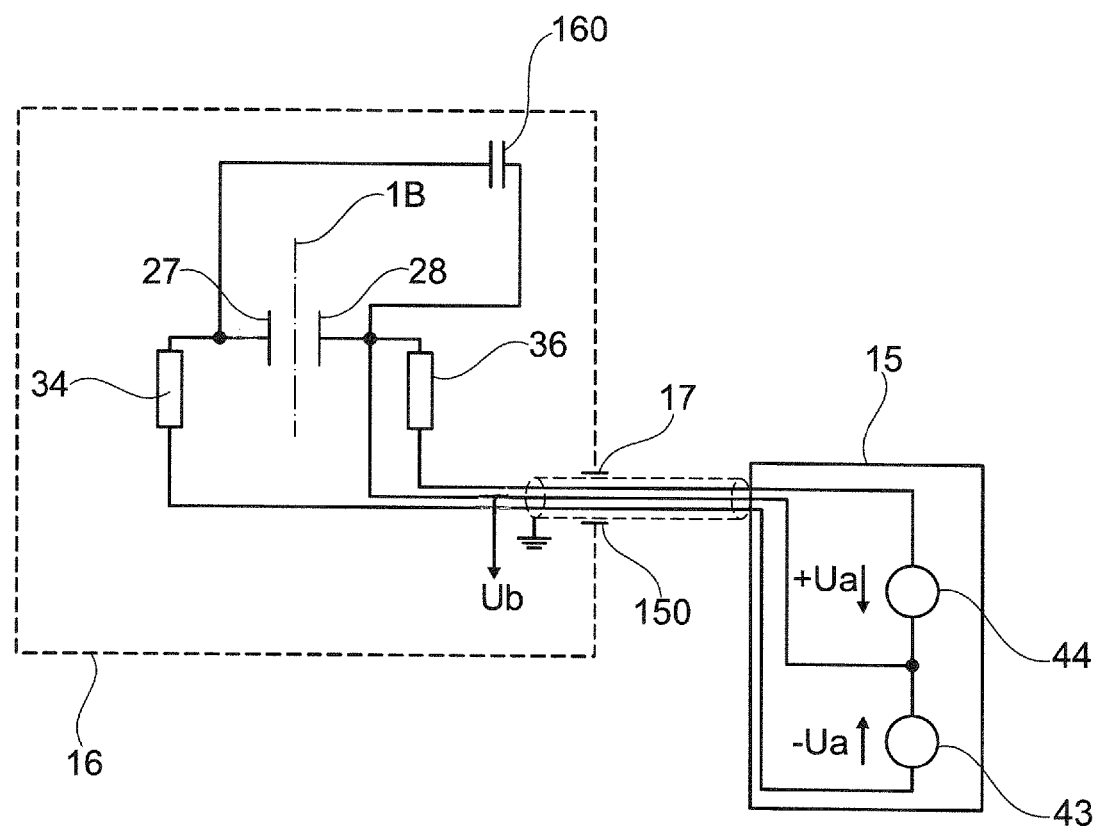
FIG. 6 is a schematic view of a further circuit diagram showing a first electrode and a second electrode of another embodiment.

FIG. 6 shows a further embodiment using a floating capacitor 160. The embodiment of FIG. 6 is based on the embodiment of FIG. 5. The same reference signs apply to the same structural elements. However, in the embodiment of FIG. 6, the first electrode 27 and the second electrode 28 are connected to the floating capacitor 160. The circuit diagram shown in FIG. 6 also applies to the third electrode 32 and the fourth electrode 33.

The first electrode 27 is connected to the first resistor 34 and to the floating capacitor 160 via connecting lines. The first resistor 34 and the floating capacitor 160 are also connected to the first voltage source 43 of the supply unit 15 and the second electrode 28 via connecting lines. More precisely, the first resistor 34 is connected to one pole of the first voltage source 43 and the floating capacitor 160 is connected to the second electrode 28. The second electrode 28 is connected to the second resistor 36 and the floating capacitor 160 via connecting lines. Moreover, the second resistor 36 and the floating capacitor 160 are also connected to the second voltage source 44 of the supply unit 15 and the first electrode 27 via connecting lines. More precisely, the second resistor 36 is connected to one pole of the second voltage source 44 and the floating capacitor 160 is connected to the first electrode 27.

The remaining poles of the first voltage source 43 and the second voltage source 44 are connected to the reference voltage $U_b$ via connecting lines.

The effects and functions with respect to the embodiment of FIG. 5 also apply to the embodiment of FIG. 6.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SD card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification and/or an attempt to put into practice the invention disclosed herein. It is intended that the specification and examples be considered as exemplary only, with the true scope and spirit of the invention being indicated by the following claims.

The invention claimed is:

1. A particle beam device, comprising:
   at least one beam generator for generating a particle beam having charged particles;
   at least one electrode unit comprising a first electrode and a second electrode, wherein the first electrode interacts with the second electrode for influencing the particle beam;
   at least one low-pass filter being connected with at least one of the first electrode and the second electrode, using an electrical connection; and
   a mounting unit comprising an opening for the passage of the particle beam, wherein the at least one low-pass filter, the first electrode and the second electrode are arranged at the mounting unit.

2. The particle beam device according to claim 1, further comprising:
   a vacuum chamber, wherein the mounting unit, the first electrode, the second electrode and the at least one low-pass filter are arranged in the vacuum chamber.

3. The particle beam device according to claim 1, further comprising at least one of the following features:
   (i) the first electrode adjoins the opening of the mounting unit; or
   (ii) the second electrode adjoins the opening of the mounting unit.

4. The particle beam device according to claim 1, further comprising:

an optical axis, wherein the optical axis passes the opening of the mounting unit.

5. The particle beam device according to claim 1, further comprising at least one of the following features:
(i) the at least one low-pass filter and the first electrode are arranged at a first distance to each other, wherein the first distance is one of: between 0.1 cm and 5 cm, between 0.5 cm and 4 cm and between 1 cm and 3 cm; or
(ii) the at least one low-pass filter and the second electrode are arranged at a second distance to each other, wherein the second distance is one of: between 0.1 cm and 5 cm, between 0.5 cm and 4 cm and between 1 cm and 3 cm.

6. The particle beam device according to claim 1, wherein the electrical connection has a length being one of: between 0.1 cm and 5 cm, between 0.5 cm and 4 cm, or between 1 cm and 3 cm.

7. The particle beam device according to claim 1, wherein the at least one low-pass filter is a first low-pass filter, and wherein the particle beam device further comprises:
a second low-pass filter being arranged at the mounting unit, wherein the first low-pass filter is connected with the first electrode and wherein the second low-pass filter is connected with the second electrode.

8. The particle beam device according to claim 1,
wherein the electrode unit comprises a third electrode and a fourth electrode, wherein the third electrode interacts with the fourth electrode for influencing the particle beam,
wherein the particle beam device further comprises a further low-pass filter being connected with at least one of: the third electrode and the fourth electrode, using a further electrical connection, and
wherein the further low-pass filter, the third electrode and the fourth electrode are arranged at the mounting unit.

9. The particle beam device according to claim 1, wherein the mounting unit is a circuit board.

10. The particle beam device according to claim 1, wherein the mounting unit is arranged in an encapsulated housing.

11. The particle beam device according to claim 1, wherein the mounting unit is an encapsulated housing.

12. The particle beam device according to claim 1, further comprising:
an objective lens for focusing the particle beam on an object; and
a detector for detecting at least one of: interaction particles and interaction radiation generated by interaction of the particle beam with the object.

13. The particle beam device according to claim 1, wherein the particle beam device is one of: an electron beam device or an ion beam device.

14. The particle beam device according to claim 1, wherein the electrode unit is a deflection unit, the particle beam device further comprising at least one of the following features:
(i) the first electrode is a first deflecting electrode; or
(ii) the second electrode is a second deflecting electrode.

15. The particle beam device according to claim 8, wherein the electrode unit is a deflection unit, and wherein the particle beam device further comprises at least one of the following features:
(i) the third electrode is a third deflecting electrode; or
(ii) the fourth electrode is a fourth deflecting electrode.

16. The particle beam device according to claim 1, wherein the electrode unit comprises at least one of:
(i) at least one correction unit;
(ii) at least one deflection unit; or
(iii) at least one multipole unit.

17. The particle beam device according to claim 1, further comprising:
an aberration corrector unit to correct for at least one of: chromatic aberration or spherical aberration of the particle beam.

18. A particle beam device, comprising:
at least one beam generator for generating a particle beam having charged particles;
at least one electrode unit comprising a first electrode and a second electrode, wherein the first electrode interacts with the second electrode for influencing the particle beam;
at least one low-pass filter being connected with at least one of: the first electrode and the second electrode, using an electrical connection; and
a vacuum chamber, wherein the at least one low-pass filter, the first electrode and the second electrode are arranged in the vacuum chamber.

19. The particle beam device according to claim 18, wherein the electrode unit is a deflection unit, and wherein the particle beam device further comprises at least one of the following features:
(i) the first electrode is a first deflecting electrode; or
(ii) the second electrode is a second deflecting electrode.

20. The particle beam device according to claim 18, wherein the electrode unit comprises at least one of:
(i) at least one correction unit;
(ii) at least one deflection unit; or
(iii) at least one multipole unit.

21. The particle beam device according to claim 18, further comprising:
an aberration corrector unit to correct for at least one of: chromatic aberration or spherical aberration of the particle beam.

* * * * *